(12) United States Patent
Wang et al.

(10) Patent No.: US 11,118,984 B2
(45) Date of Patent: Sep. 14, 2021

(54) USE OF ACTUATOR AS SENSOR FOR INPUT

(71) Applicant: GOOGLE LLC, Mountain View, CA (US)

(72) Inventors: Jianxun Wang, Sunnyvale, CA (US); Debanjan Mukherjee, San Jose, CA (US)

(73) Assignee: Google LLC, Mountain View, CA (US)

( * ) Notice: Subject to any disclaimer, the term of this patent is extended or adjusted under 35 U.S.C. 154(b) by 197 days.

(21) Appl. No.: 16/432,920

(22) Filed: Jun. 5, 2019

(65) Prior Publication Data
US 2020/0386631 A1 Dec. 10, 2020

(51) Int. Cl.
*G01L 1/22* (2006.01)
*G01L 1/10* (2006.01)
*G06F 3/041* (2006.01)
*H05K 5/00* (2006.01)

(52) U.S. Cl.
CPC .......... *G01L 1/106* (2013.01); *G01L 1/2206* (2013.01); *G06F 3/0414* (2013.01); *H05K 5/0017* (2013.01); *H05K 5/0086* (2013.01); *G06F 2203/04105* (2013.01)

(58) Field of Classification Search
CPC ..... G01L 1/106; G01L 1/2206; G06F 3/0414; G06F 2203/04105; H05K 5/0017; H05K 5/0086
See application file for complete search history.

(56) References Cited

U.S. PATENT DOCUMENTS

| 5,442,146 A * | 8/1995 | Bell ..................... G01G 3/1412 |
| | | 177/210 FP |
| 10,496,193 B1 * | 12/2019 | Alfano ................ G06F 3/03547 |
| 2009/0133509 A1 * | 5/2009 | Ford ....................... G01L 1/162 |
| | | 73/862.59 |
| 2011/0102162 A1 | 5/2011 | Gregorio et al. |
| 2011/0152725 A1 * | 6/2011 | Demir .................... A61B 5/103 |
| | | 600/587 |
| 2011/0291821 A1 | 12/2011 | Chung |
| 2014/0320402 A1 * | 10/2014 | Stahlberg ................ G06F 3/016 |
| | | 345/156 |

(Continued)

FOREIGN PATENT DOCUMENTS

WO 2009051976 A1 4/2009

OTHER PUBLICATIONS

International Search Report and Written Opinion of International Application No. PCT/US2019/064162, dated Mar. 23, 2020, 14 pp.

(Continued)

*Primary Examiner* — Max H Noori
(74) *Attorney, Agent, or Firm* — Shumaker & Sieffert, P.A.

(57) ABSTRACT

An electronic device including an actuator and a driving circuit electrically coupled to the actuator. The driving circuit can be configured to determine a resonance frequency of the actuator and deliver a driving frequency matching the resonance frequency to the actuator, as well as a driving voltage. The electronic device also includes a memory and a processor. The processor can determine the presence of a force applied to the electronic device based on the resonance frequency of the actuator. Based on determining a force is being applied to the electronic device, the processor can execute a predetermined function of the electronic device.

20 Claims, 4 Drawing Sheets

(56) References Cited

U.S. PATENT DOCUMENTS

| | | | | |
|---|---|---|---|---|
| 2015/0150122 | A1* | 5/2015 | Son | A61B 5/02438 |
| | | | | 726/20 |
| 2016/0041672 | A1* | 2/2016 | Hoen | G06F 3/0416 |
| | | | | 345/173 |
| 2016/0253020 | A1* | 9/2016 | Frey | G06F 3/0414 |
| | | | | 345/174 |
| 2016/0357298 | A1* | 12/2016 | Kim | G06F 1/1643 |
| 2017/0220171 | A1* | 8/2017 | Shin | H04M 1/0266 |
| 2018/0188850 | A1* | 7/2018 | Heath | A63B 71/0622 |
| 2019/0064017 | A1* | 2/2019 | Shin | G01L 5/0052 |
| 2019/0094967 | A1* | 3/2019 | Bisbee | G06F 3/0416 |
| 2019/0340896 | A1* | 11/2019 | Phan Le | G06F 3/016 |

OTHER PUBLICATIONS

Hwang et al., "VibPress: Estimating Pressure Input Using Vibration Absorption on Mobile Devices," Aug. 28, 2013, Mobile HCI 2013—Tactile User Interfaces, 4 pp.

Goel et al., "GripSense: Using Built-In Sensors to Detect Hand Posture and Pressure on Commodity Mobile Phones," Oct. 2012, ResearchGate, Published online Jan. 28, 2016, 11 pp.

* cited by examiner

USE OF ACTUATOR AS SENSOR FOR INPUT

BACKGROUND

Electronic devices can be configured to detect various forces applied by a user to the device housing, such as tapping, touching, sliding, squeezing, and the like, and to trigger various features in response. For example, detecting a force can be achieved by including a deformable material in the electronic device housing and detecting the resistance of one or more strain gauges positioned along the deformable material.

BRIEF SUMMARY

According to an embodiment of the disclosed subject matter, an electronic device can include an actuator. The electronic device can also include a driving circuit electrically coupled to the actuator. The driving circuit can be configured to determine a resonance frequency of the actuator by sampling a counter-electromotive force of the actuator, deliver a driving frequency to the actuator that substantially matches the resonance frequency and deliver a first driving voltage to the actuator. The electronic device can also include a memory and a processor. The processor can be configured to determine the presence of a force applied to the electronic device and execute a predetermined function of the electronic device. The presence of the force applied can be determined by sampling, at a sampling frequency, the driving frequency delivered by the driving circuit. The sampling frequency can be adjusted based on power available to the electronic device.

The processor can further determine, based on the determined resonance frequency being within a predetermined frequency range, that the electronic device is being held or squeezed by the user.

The driving circuit can also deliver a second driving voltage to the actuator to provide haptic feedback in response to the processor receiving a user input. The second driving voltage can be greater than the first driving voltage.

The processor can also determine a change in the resonance frequency and determine that the user is squeezing the electronic device in response to the change in the resonance frequency exceeding a predetermined threshold stored in the memory. The predetermined threshold may be 1 Hz. The change in the resonance frequency can be a decrease in the resonance frequency.

Additional features, advantages, and embodiments of the disclosed technologies are set forth or apparent from consideration of the following detailed description, drawings, and claims. Moreover, it is to be understood that both the foregoing summary and the following detailed description are illustrative and are intended to provide further explanation without limiting the scope of the claims.

BRIEF DESCRIPTION OF THE DRAWINGS

The accompanying drawings, which are included to provide a further understanding of the disclosed technologies, are incorporated in and constitute a part of this specification. The drawings also illustrate embodiments of the disclosed technologies and together with the detailed description serve to explain the principles of implementations of the disclosed technologies. No attempt is made to show structural details in more detail than may be necessary for a fundamental understanding of the disclosed technologies and various ways in which it may be practiced.

DETAILED DESCRIPTION

Figure 1:
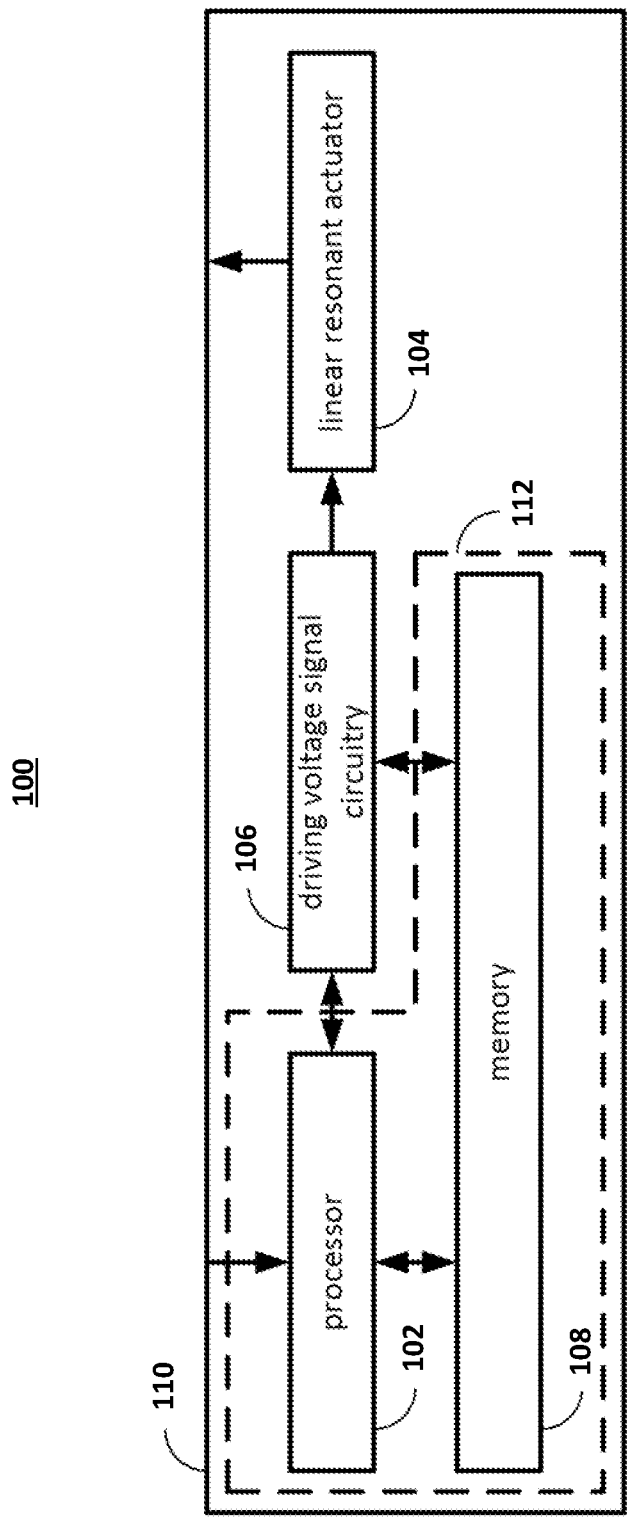
FIG. 1 is a block diagram of an example of an electronic device, according to the disclosed subject matter.

Conventional techniques to detect forces such as touches, taps, squeezes, and the like that are applied to electronic devices such as smart phones and tablets often rely on the inclusion of components such as deformable materials coupled to strain gauges, sensors, resistors, capacitors, accelerometers, gyroscopes, and microphones. However, such components can be complex to integrate into the device without negatively affecting other components of the device and may add undesirable cost and fabrication complexity to the device. Accordingly, as disclosed herein, it has been determined that haptic feedback components may be used to detect the application of such forces to the device.

As used herein, a statement that a component can be "configured to" perform an operation can be understood to mean that the component requires no structural alterations, but merely needs to be placed into an operational state (e.g., be provided with electrical power, have an underlying operating system running, etc.) in order to perform the operation.

Electronic devices can be configured to communicate information in a haptic, i.e., tactile manner. Haptic technology can be used to provide feedback to a user in response to receipt of an input by imparting a vibration or pattern of vibrations to the housing of an electronic device. Various haptic technologies can be used to produce such vibrations. Such haptic technologies can include, for example, piezo-electric actuators, eccentric rotating mass actuators, and linear resonant actuators.

The present subject matter discloses techniques for using a linear resonant actuator to detect a user applying a force to an electronic device. The detected force may include, for example, a user squeezing the device, tapping or touching the screen or another surface of the device, pressing on an edge, screen, surface, or other component of the device, or the like. As previously discussed, the linear resonant actuator may perform additional functions within the electronic device, such as providing haptic feedback by producing vibrations. By utilizing a linear resonant actuator to function as a sensor as disclosed herein, the cost and complexity of manufacturing the electronic device may be reduced since the need for conventional strain gauges and the associated circuitry may be obviated. Furthermore, the techniques disclosed herein may allow the system architect to realize additional physical space within the electronic device. This additional space may be used to increase the size and capacity of the battery or storage memory, for example.

A linear resonant actuator can include, for example, a coil, a magnetic mass, and a spring. A driving voltage signal having an alternating current waveform can be applied to the coil (e.g., in response to the receipt of the input signal caused by the user). A current produced in the coil by the driving voltage signal can interact with the magnetic field produced by the magnetic mass to produce a Lorentz force. The Lorentz force can impart a motion to the magnetic mass. Because the driving voltage signal has an alternating current waveform, the motion of the magnetic mass can take the form of oscillations (i.e., vibrations). The magnetic mass can be attached to the spring. Typically, the alternating current waveform can cause the oscillations to occur at a "resonance frequency" of the spring, which also may be referred to as the "resonant frequency" of the system. Friction and flexibility of the materials used in constructing the system components can dampen the motion of the linear resonant actuator.

FIG. 1 is a block diagram of an example of an electronic device 100, according to the disclosed subject matter. The electronic device 100 can include, for example, a processor 102, a linear resonant actuator 104, a driving voltage signal circuitry 106, a memory 108, and a housing 110. The electronic device 100 can include a system 112 for determining that a force is being applied to the housing 110 and trigger a function in response. The system 112 can include, for example, the processor 102 and the memory 108. The electronic device 100 can be a phone, smart phone, smart watch other wearable technology product, or the like. Processor 102 may be configured to read and write to memory 108. Processor 102 may additionally be configured to communicate instructions to driving voltage signal circuitry 106 to read and change its operating status and operating modes, such as to sample its resonance frequency output and to adjust its output driving voltage.

Figure 2:
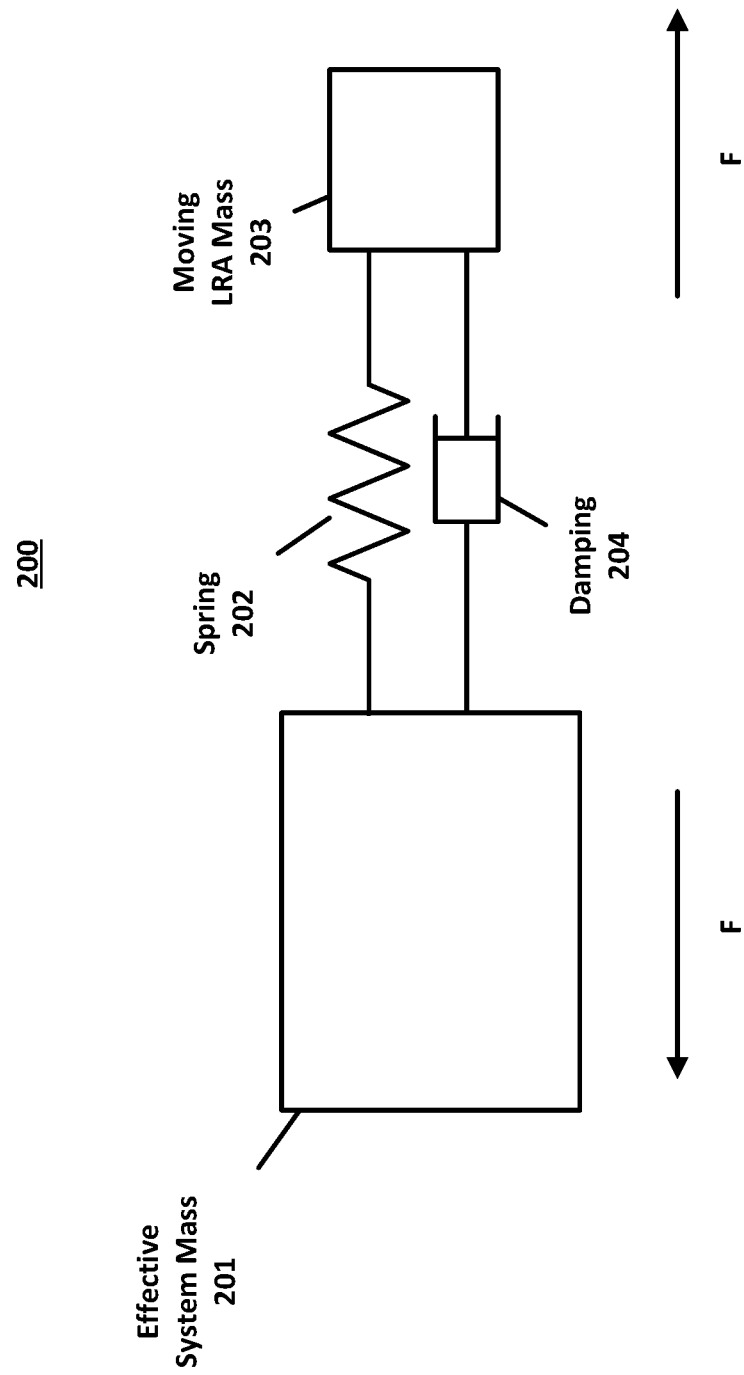
FIG. 2 is a force diagram of an example of an electronic device, according to the disclosed subject matter.

FIG. 2 illustrates a force diagram 200 showing the relationship between the effective system mass 201 and the moving mass of the linear resonant actuator 203. The effective system mass may include for example, the sum of: the mass of the electronic device 100 and the mass of anything else rigidly attached to the electronic device 100. Spring 202 may be a component of linear resonant actuator 203 and defined by a spring constant specified by the manufacturer. Damping 204 represents the energy loss that occurs in each cycle due to, for example, friction and the material flexibility of the system components, which would be expected in any physical system. The simple arrangement shown in FIG. 2 provides a conceptual model for haptic components suitable for use with the subject matter disclosed herein, but it will be understood that specific haptic components may include different arrangements of components and devices that may not include the conceptual components shown in FIG. 2. However, the components of such haptic devices typically still may be modeled as a mass-spring system as shown regardless of the actual physical components included in the devices.

A linear resonant actuator 104 can impart the greatest force at its specific resonant frequency. By driving the linear resonant actuator 104 at its resonant frequency, energy efficiency is maximized. Driving the linear resonant actuator 104 at even a few fractions of cycles per second (Hz) above or below the resonant frequency may begin to cause the powered Lorentz force to be opposed by the spring force, thereby inefficiently wasting energy. Because the associated magnets, springs, and coils may typically be manufactured within a tolerance range of acceptable specifications, the resonant frequency for a linear resonant actuator 104 may vary slightly from unit to unit. Similarly, as the linear resonant actuator 104 ages, the spring 202 may stretch or compress, which may also vary the resonant frequency. Therefore, the driving voltage signal circuitry 106 may use the counter-electromotive force generated by the linear resonant actuator 104 to continually detect the resonance frequency. The driving voltage signal circuitry 106 may drive the linear resonant actuator 104 at the resonance frequency determined on an ongoing basis. In this way, the linear resonant actuator 104 may use power more efficiently while applying a greater Lorentz force regardless if the resonance frequency changes for any reason.

In general, the resonance frequency of an object is proportional to its rigidity and its mass (i.e., the stiffer the object, the higher its resonance frequency; the greater the mass of the object, the lower its resonance frequency). The "free boundary" resonant frequency of the linear resonant actuator 104 may be specified by the manufacturer or may be experimentally determined when completely isolated or rigidly affixed to an object having a large mass, such as a factory floor, for example. In general, the free boundary resonance frequency may be between 50 and 300 Hz. In an example, the manufacturer-specified resonance frequency of the linear resonant actuator 104 may be 159 Hz. It may be determined that the resonance frequency of the linear actuator 104 changes when the electronic device 100 is held by a user. For example, the resonance frequency may change to a value in the range of 160.25-161.25 Hz, preferably 160.75 Hz, when held normally in the hand of a user. The effective system mass 201 in this example may be approximately equal to the mass of the electronic device 100. Additionally, it may be determined that the resonance frequency of the linear resonant actuator 104 changes when a user applies a force to the electronic device 100. For example, the resonance frequency may decrease to a value in the range of 158.75-159.75, preferably 159.25, when squeezed by a user's hand or pressed against a hard surface. In this example, the effective system mass 201 may be approximately equal to the weight of the user's hand and/or arm. The specific frequencies and frequency changes described herein are provided as illustrative examples, but the actual resonance frequencies of haptic feedback devices suitable for use with the subject matter disclosed herein may vary within other ranges. In general, the change in resonance frequency resulting from a user holding or applying a force to a device may be a few tenths to a few percent of the resonance frequency of the device when no force is applied. While the previous examples are described in the context of a user holding the electronic device 100 and applying a force using his or her hand, it should be appreciated that the disclosed subject matter also may apply to a user wearing a glove or applying the force using another object, such as a stylus because the relevant sensors may be entirely force-based and thus may not require direct skin contact, a conductive surface in contact with the device, or the like.

Figure 3:
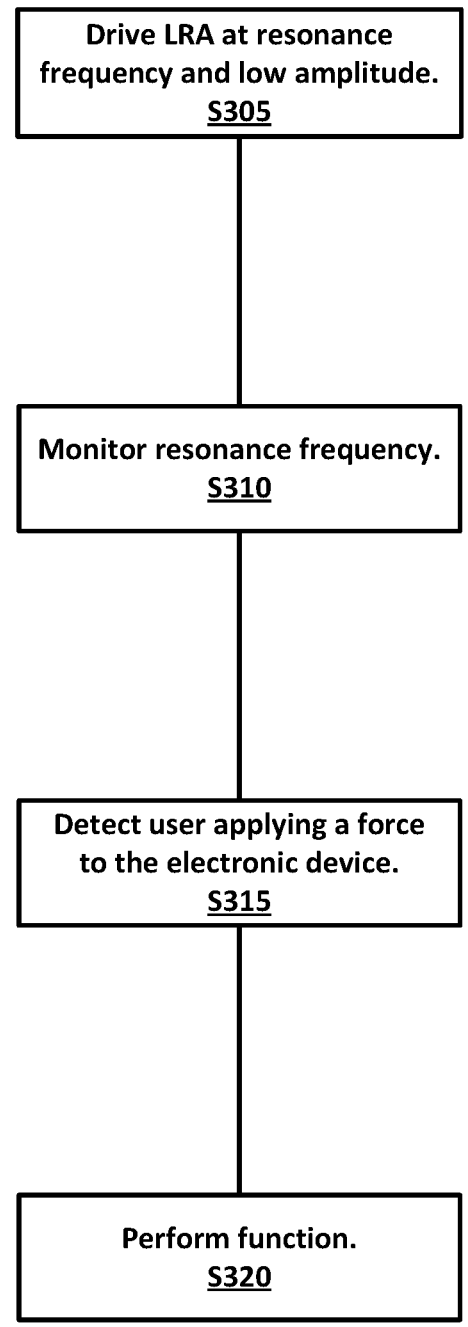
FIG. 3 is a flow diagram of an example of a method, according to the disclosed subject matter.

FIG. 3 is a flow diagram of an example of a method 300 for determining when a user is applying a force to the electronic device 100. Prior to stage S305, the driving voltage signal circuitry 106 may be inactive to conserve power and reduce heat buildup. Stage S305 may commence upon determining that a user has picked up the electronic device 100 or otherwise determining, via a spoken command, touch input, or gesture, for example, that the user may begin interacting with it. In stage S305, the processor 102 may direct the driving voltage signal circuitry 106 to drive the linear resonant actuator 104 at its resonance frequency. Because the actual resonance frequency may not be known initially, the processor 102 may direct the driving voltage signal circuitry 106 via an instruction or signal to begin driving the linear resonant actuator 104 at a default resonance frequency that may correspond to the manufacturer's specification or a last-known value, for example. As previously discussed, the resonant frequency of the actuator may differ from the manufacturer's specification due to age, temperature, and the construction, materials, and mass of the electronic device 100 that houses the linear resonant actuator 104. Therefore, the manufacturer's specified resonance frequency may be used as a starting point for driving linear resonant actuator 104. Subsequent to the completion of at least one driving cycle, the driving voltage signal circuitry 106 may begin dynamically adjusting the resonance frequency to match its determination based on the counter-electromotive force. The driving voltage signal circuitry 106 may drive the linear resonant actuator 104 at a low voltage that corresponds to a low vibration amplitude that is imperceptible to the user. For example, the linear resonant actuator 104 may be driven 0.2 V or approximately 5% of the driving voltage that may be normally used for haptics feedback. In this way, the power consumed by this technique may be relatively small. It should be appreciated that at any time, regardless of whether linear resonant actuator 104 is operating at low vibration amplitude or low driving voltage, it may also provide haptic feedback in response to a user input. The haptic feedback may be provided at at a higher, perceptible vibration amplitude. The higher vibration amplitude may be achieved by driving the linear resonant actuator 104 using the driving voltage signal circuitry 106 at a higher driving voltage, such as 3.6 V, for example. Therefore, using the linear actuator 104 to determine when a user is applying a force to the electronic device 100 may not disrupt or interfere with simultaneously using the linear actuator 104 to provide haptic feedback to the user.

While driving the linear resonant actuator 104 using the driving voltage signal circuitry 106, the driving voltage signal circuitry 106 may detect the resonance frequency of the linear resonant actuator 104. The driving voltage signal circuitry 106 may achieve this detection by sampling the counter-electromotive force at its output during each cycle. In S310, the processor 102 may monitor the resonance frequency by periodically sampling the driving voltage signal circuitry 106 at varying sampling frequencies. For example, processor 102 may sample the resonance frequency at a rate of 50-250 Hz (between every 4 to 20 milliseconds). The sampling frequency may be dependent on the available power to the electronic device 100. For example, the sampling frequency may be adjusted based on the remaining battery life of the electronic device 100 and/or whether an external power source has been connected to the electronic device 100.

In S315, processor 102 may detect that a user is applying a force to the electronic device 100. This detection may be implemented in a variety of ways. In a first example, the processor 102 may store a range of resonance frequency values within memory 108 corresponding to the resonance frequency that may be anticipated when a force is applied to the electronic device 100. Following this example, when the processor 102 determines that the sampled resonance frequency at which the driving voltage signal circuitry 106 is operating falls within the stored range, the processor 102 may determine that a force is being applied to the electronic device 100. Alternatively, or in addition, in a second example, processor 102 may store one or more past sampled resonance frequency values within memory 108 and compare with a current sampled resonance frequency value. Upon determining that the sampled resonance frequency has decreased by a predetermined amount, the processor 102 may determine that a force is being applied to the electronic device 100. In an embodiment, the mobile device 100 may be a mobile phone, and the predetermined amount by which the resonance frequency decreases may be 1 Hz or greater, preferably at least 1.5 Hz. Where the mobile device 100 is of a smaller mass, such as a smart watch or other wearable device, the predetermined amount by which the resonance frequency decreases may be greater than 1.5 Hz. It should be appreciated that the first and second examples previously described may be used individually or in combination. Additionally, it should be appreciated that processor 102 may be programmed to detect a "gestured" force, such as for example, a short duration versus a long duration force, a predetermined number of applied forces, and/or any combination of the foregoing.

Furthermore, multiple forces or changes in force amplitude may be detected by detecting corresponding changes in the resonance frequency of one or more actuators within the device. For example, a gradual change over a longer period of time in the resonance frequency from an initial value to a final different value than is expected for a typical "squeeze" force may indicate a slow or long squeeze. As another example, rapid changes between similar values in the resonance frequency may indicate a series of squeezes, presses, or other force applied to the device.

In S320, processor 102 may execute a function on the electronic device 100 corresponding to the detected force(s). The function may be, for example, to launch a virtual assistant application or other predetermined application on the electronic device 100, to silence the electronic device 100, to lock the electronic device 100, and the like. Different functions may be executed based upon different detected forces. For example, a "long squeeze" as previously disclosed may be used to execute a different function than a "short squeeze" or other force. As another example, multiple taps, squeezes, presses, or the like may be used to execute different functions than a single tap, squeeze, press, or the like. More generally, any detected force or combination of forces may be used to trigger execution of a function, which may be different from other functions executed based upon a different detected force or combination of forces.

System 112 may cause linear resonant actuator 104 to operate in a plurality of states including an "haptics state" and a "sensing state" as discussed above. It should be appreciated that each of the haptics and sensing states may be equally operable exclusively or together in combination. For example, where system 112 causes linear resonant actuator 104 to vibrate perceptibly for providing a haptics output, the system 112 may still monitor the resonance frequency of the driving voltage signal circuitry 106 and detect whether a force has been applied as previously described with reference to S310 and S315 of FIG. 3. While in the haptics state, the linear resonant actuator 104 may be driven at a higher voltage such that vibrations of a larger amplitude are produced and perceptibly felt by the user. In the sensing state, the linear resonant actuator 104 may be driven at a lower voltage such that vibrations of a lower amplitude are produced and are not perceptible to the user. In general, the driving frequency of linear resonant actuator 104 may be the resonant frequency, as detected by the driving voltage signal circuitry 106, regardless of the state in which the system 112 is operating.

Figure 4:
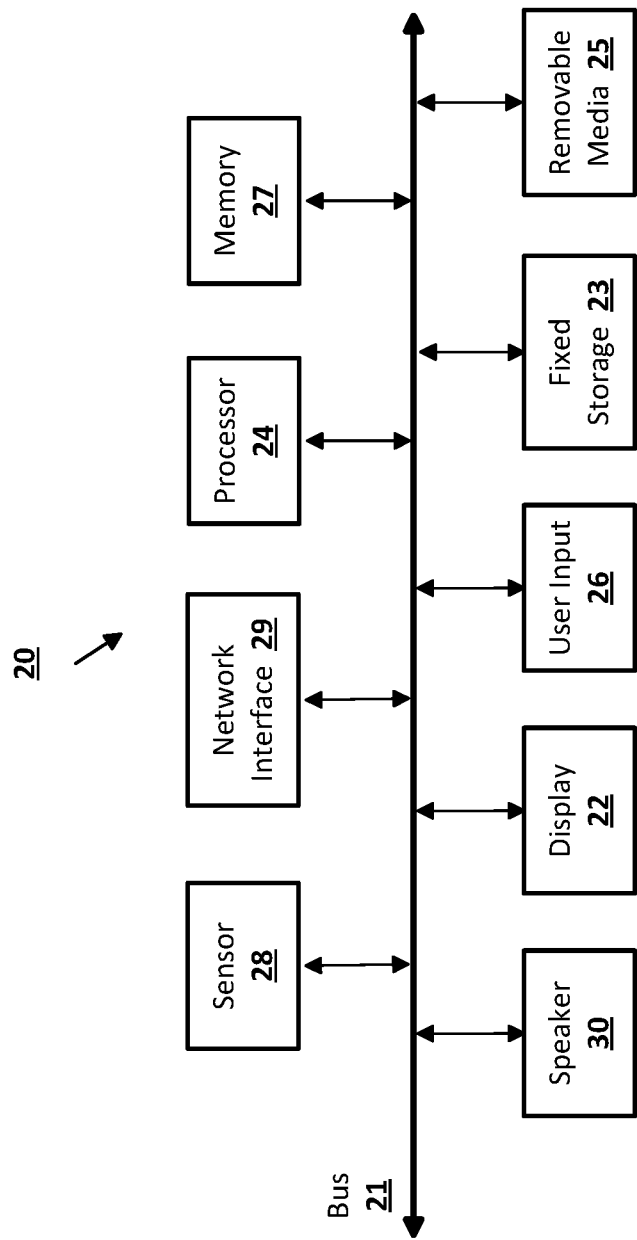
FIG. 4 is a block diagram of an example of a computing device suitable for implementing certain devices.

FIG. 4 is a block diagram of an example of a computing device 20 suitable for implementing certain devices. The computing device 20 can be used to implement, for example, the electronic device 100 as described above The computing device 20 can include a bus 21 that interconnects major components of the computing device 20. Such components can include a central processor 24; a memory 27 (such as Random Access Memory (RAM), Read-Only Memory (ROM), flash RAM, or the like), a sensor 28 (which can include one or more sensors), a display 22 (such as a display screen), an input interface 26 (which can include one or more input devices such as a keyboard, mouse, keypad, touch pad, turn-wheel, and the like), a fixed storage 23 (such as a hard drive, flash storage, and the like), a removable media component 25 (operable to control and receive a solid-state memory device, an optical disk, a flash drive, and the like), a network interface 29 (operable to communicate with one or more remote devices via a suitable network connection), and a speaker 30 (to output an audible communication). In some embodiments the input interface 26 and the display 22 can be combined, such as in the form of a touchscreen.

The bus 21 can allow data communication between the central processor 24 and one or more memory components 23, 27, which can include RAM, ROM, or other memory. Applications resident with the computing device 20 generally can be stored on and accessed via a computer readable storage medium.

The fixed storage 23 can be integral with the computing device 20 or can be separate and accessed through other interfaces. The network interface 29 can provide a direct connection to the premises management system and/or a remote server via a wired or wireless connection. The network interface 29 can provide such connection using any suitable technique and protocol, including digital cellular telephone, WiFi™, Thread®, Bluetooth®, near field communications (NFC), and the like. For example, the network interface 29 can allow the computing device 20 to communicate with other components of the premises management system or other computers via one or more local, wide-area, or other communication networks.

The foregoing description, for purpose of explanation, has been described with reference to specific configurations. However, the illustrative discussions above are not intended to be exhaustive or to limit configurations of the disclosed technologies to the precise forms disclosed. Many modifications and variations are possible in view of the above teachings. The configurations were chosen and described in order to explain the principles of the disclosed technologies and their practical applications, to thereby enable others skilled in the art to utilize those configurations as well as various configurations with various modifications as may be suited to the particular use contemplated.

The invention claimed is:

1. A method of detecting application of a force to a housing of an electronic device, the method comprising:
    determining, by a processor, a first resonance frequency of an actuator in the electronic device;
    determining, by the processor and based on the determined resonance frequency, presence of a force applied to the electronic device, wherein determining the presence of the force comprises determining, by the processor and based on the determined resonance frequency, whether the housing of the electronic device is being squeezed; and
    executing a predetermined function of the electronic device in response to determining that the housing of the electronic device is being squeezed.

2. The method of claim 1 wherein the determining the resonant frequency comprises sampling a counter-electromotive force of the actuator.

3. The method of claim 1, wherein the determining the presence of a force applied to the electronic device comprises periodically sampling the resonance frequency of the actuator.

4. The method of claim 1, further comprising:
    determining, by the processor, that the electronic device is being held but not squeezed in response to the determined resonance frequency being within a predetermined frequency range.

5. The method of claim 1, further comprising:
    delivering an instruction, by the processor, to drive the actuator at the determined resonance frequency and at a first driving voltage.

6. The method of claim 5, further comprising:
    delivering an instruction, by the processor, to drive the actuator at the determined resonance frequency and at a second driving voltage in response to receiving a user input to provide haptic feedback, the second driving voltage being greater than the first driving voltage.

7. The method of claim 1, wherein determining whether the housing of the electronic device is being squeezed further comprises:
    determining, by the processor, a change in the resonance frequency; and
    determining, by the processor, that the housing of the electronic device is being squeezed in response to the change in the resonance frequency exceeding a predetermined threshold.

8. The method of claim 7, wherein the change in the resonance frequency is a decrease in the resonance frequency.

9. The method of claim 1, wherein determining whether the housing of the electronic device is being squeezed further comprises:
    determining, by the processor, that the housing of the electronic device is being squeezed in response to the determined resonance frequency being within a predetermined frequency range.

10. An electronic device comprising a housing, the housing comprising:
    an actuator;
    a driving circuit electrically coupled to the actuator and configured to:
        determine a resonance frequency;
        deliver a driving frequency to the actuator that substantially matches the resonance frequency; and
        deliver a first driving voltage to the actuator;
    a memory; and
    a processor configured to:
        determine presence of a force applied to the electronic device, wherein to determine the presence of the force, the processor is configured to determine, based on the determined resonance frequency, whether the housing of the electronic device is being squeezed; and
        execute a predetermined function of the electronic device in response to determining that the housing of the electronic device is being squeezed.

11. The electronic device of claim 10, wherein the resonance frequency is determined by sampling a counter-electromotive force of the actuator.

12. The electronic device of claim 10, wherein the presence of the force applied to the electronic device is determined by sampling, at a sampling frequency, the driving frequency delivered by the driving circuit.

13. The electronic device of claim 10, wherein the processor is further configured to determine, based on the determined resonance frequency being within a predetermined frequency range, that the housing of the electronic device is being held but not squeezed.

14. The electronic device of claim 10, wherein the driving circuit is further configured to deliver a second driving voltage to the actuator to provide haptic feedback in response to the processor receiving a user input, the second driving voltage being greater than the first driving voltage.

15. The electronic device of claim 10, wherein, to determine whether the housing of the electronic device is being squeezed, the processor is further configured to:
   determine a change in the resonance frequency; and
   determine that the housing of the electronic device is being squeezed in response to the change in the resonance frequency exceeding a predetermined threshold stored in the memory.

16. The electronic device of claim 15, wherein the change in the resonance frequency is a decrease in the resonance frequency.

17. The electronic device of claim 10, wherein, to determine whether the housing of the electronic device is being squeezed, the processor is further configured to:
   determine that the housing of the electronic device is being squeezed in response to the determined resonance frequency being within a predetermined frequency range stored in the memory.

18. The electronic device of claim 12, wherein the processor is further configured to adjust the sampling frequency based on power available to the electronic device.

19. The method of claim 1, wherein the actuator comprises a linear resonant actuator (LRA).

20. The method of claim 1, wherein the electronic device comprises a wearable device.

\* \* \* \* \*